(12) United States Patent
Matsumoto et al.

(10) Patent No.: US 9,387,607 B2
(45) Date of Patent: Jul. 12, 2016

(54) IMPRINT APPARATUS, IMPRINT METHOD, AND METHOD FOR PRODUCING DEVICE

(75) Inventors: Hideki Matsumoto, Utsunomiya (JP); Fumio Sakai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 215 days.

(21) Appl. No.: 13/451,925

(22) Filed: Apr. 20, 2012

(65) Prior Publication Data

US 2012/0274006 A1 Nov. 1, 2012

(30) Foreign Application Priority Data

Apr. 28, 2011 (JP) ................. 2011-101311

(51) Int. Cl.
| | | |
|---|---|---|
| *G03F 7/00* | (2006.01) | |
| *B29C 37/00* | (2006.01) | |
| *B29C 43/02* | (2006.01) | |
| *B29C 43/56* | (2006.01) | |
| *B29C 59/02* | (2006.01) | |
| *B29L 31/00* | (2006.01) | |

(52) U.S. Cl.
CPC .......... *B29C 37/0003* (2013.01); *B29C 43/021* (2013.01); *B29C 43/56* (2013.01); *B29C 59/02* (2013.01); *B29C 59/026* (2013.01); *B29C 2059/023* (2013.01); *B29L 2031/757* (2013.01); *G03F 7/0002* (2013.01)

(58) Field of Classification Search
CPC ................................................ B29C 2059/023
USPC ............................................. 977/887; 8/887
See application file for complete search history.

(56) References Cited

U.S. PATENT DOCUMENTS

| 7,517,211 | B2* | 4/2009 | Kruijt-Stegeman et al. .. | 425/385 |
|---|---|---|---|---|
| 2006/0172031 | A1* | 8/2006 | Babbs et al. ................... | 425/385 |
| 2006/0172553 | A1* | 8/2006 | Choi et al. ..................... | 438/780 |
| 2007/0190200 | A1* | 8/2007 | Cherala et al. ................ | 425/385 |
| 2010/0233377 | A1* | 9/2010 | Aoki et al. ..................... | 427/355 |

FOREIGN PATENT DOCUMENTS

| JP | 2004-006706 A | 1/2004 |
|---|---|---|
| JP | 2007-083626 A | 4/2007 |
| JP | 2010-098310 A | 4/2010 |
| JP | 2011-029642 A | 2/2011 |

OTHER PUBLICATIONS

Zhang, W., and S. Chou, Fabrication of 60-nm transistors on 4-in. wafer using nanoimprint at all lithography levels, Applied Physics Letters, vol. 83, No. 8 (2003), pp. 1632-1634.*

\* cited by examiner

*Primary Examiner* — Matthew Daniels (74) *Attorney, Agent, or Firm* — Canon USA, Inc. IP Division (57) ABSTRACT

An imprint apparatus for transferring a pattern to an imprint material using a mold includes a substrate holding mechanism and a control unit. The substrate holding mechanism is configured to be divided into a plurality of areas, capable of varying an attracting force for attracting the substrate in each of the areas and to hold the substrate. The control unit is configured to, when a plurality of shots is formed on the substrate, control an imprint operation of transferring the pattern to the plurality of shots which are not adjacent to one another, makes the attracting force in the area of the substrate holding mechanism corresponding to the shot to which the pattern is transferred among the plurality of areas smaller than the attracting force at the time of the imprint operation and suck the substrate.

12 Claims, 11 Drawing Sheets

IMPRINT APPARATUS, IMPRINT METHOD, AND METHOD FOR PRODUCING DEVICE

BACKGROUND OF THE INVENTION

1. Field of the Invention

Embodiments of the present invention relate to an imprint apparatus and an imprint method in which an imprint material is supplied onto a substrate and a pattern of a mold is transferred to the imprint material, and a method for producing a device.

2. Description of the Related Art

An imprint technique is one that is capable of transferring a pattern formed on a mold. The imprint technique transfers a pattern to an imprint material supplied on a substrate such as a silicon wafer or a glass plate using a mold on which the pattern is formed by an electron beam exposure apparatus. The pattern is transferred such that a resin as the imprint material is supplied on the substrate and cured with the pattern of the mold pressed against the resin supplied on the substrate and the mold is removed from the cured resin.

Such a pattern transfer is sequentially performed to a plurality of shot positions on the substrate. After the pattern transfer to the plurality of shot positions on the substrate is finished, the substrate is carried to the outside of the imprint apparatus.

In general, a substrate chuck for holding the substrate uniformly sucks and holds the other side of the substrate on which the pattern is transferred.

On the other hand, Japanese Patent Application Laid-Open No. 2010-98310 discusses a method in which a substrate is held with a suction area divided into a plurality of pieces to reduce a pattern defect. Japanese Patent Application Laid-Open No. 2010-98310 also discusses a method for detaching a mold such that a force of sucking the area corresponding to a position of the substrate against which a pattern portion formed on the mold is pressed is locally weakened.

However, the method discussed in Japanese Patent Application Laid-Open No. 2010-98310 locally distorts not only the area with which the pattern portion is brought into contact but its periphery due to a force when detaching or heat of irradiation light, so that a fine pattern cannot be correctly transferred to an adjacent shot position.

SUMMARY OF THE INVENTION

One disclosed aspect of the embodiments provides a method for accurately transferring a pattern to a resin supplied to a substrate even if a local distortion occurs in the substrate.

According to an aspect of the embodiments, an imprint apparatus for transferring a pattern to an imprint material supplied to a substrate using a mold on which the pattern is formed includes a substrate holding mechanism configured to be divided into a plurality of areas, capable of varying an attracting force for attracting the substrate in each of the plurality of the areas and to hold the substrate, and a control unit, in which the control unit is configured to, when a plurality of shots is formed on the substrate, control an imprint operation of transferring the pattern to the plurality of shots which are not adjacent to one another, makes the attracting force in the area of the substrate holding mechanism corresponding to the shot to which the pattern is transferred among the plurality of the areas smaller than the attracting force at the time of the imprint operation and suck the substrate.

Further features and aspects of the embodiments will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the embodiments and, together with the description, serve to explain the principles of the invention.

DESCRIPTION OF THE EMBODIMENTS

Various exemplary embodiments, features, and aspects of the embodiments will be described in detail below with reference to the drawings.

Figure 1:
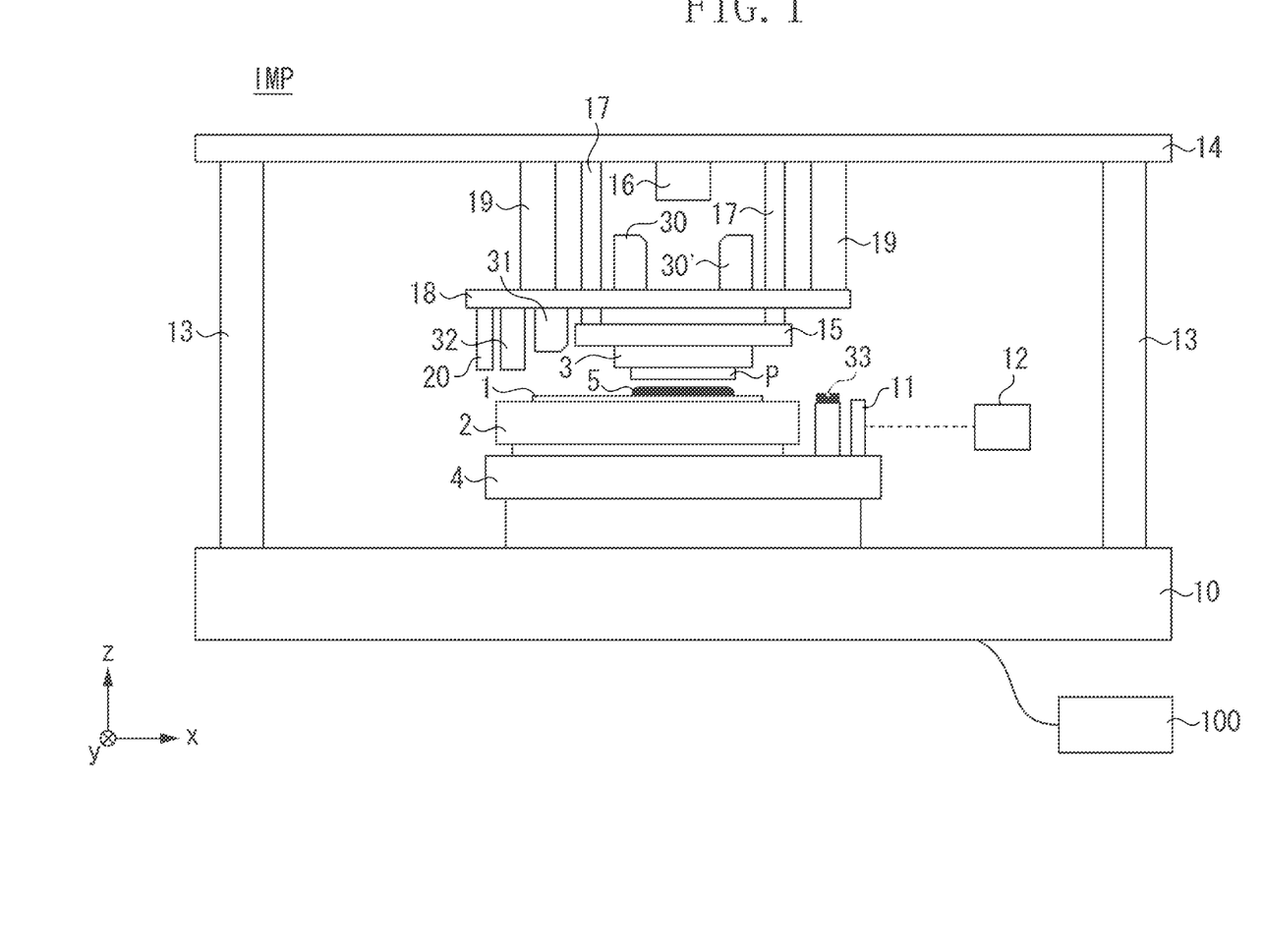
FIG. 1 is a schematic diagram of an imprint apparatus according to a first exemplary embodiment.

A first exemplary embodiment is described below. FIG. 1 is a schematic diagram of an imprint apparatus IMP according to the first exemplary embodiment. In FIG. 1, a substrate chuck 2 (a substrate holding mechanism) holds a substrate 1. A substrate stage 4 positions the substrate 1 at a predetermined position. The substrate stage 4 may be provided with a micromotion stage including a function of correcting a position in a θ direction (rotation around a z-axis) of the substrate 1, a function of adjusting a position z of the substrate 1, and a tilt function of correcting a tilt of the substrate 1.

A base surface plate 10 is the one on which the substrate stage 4 is laid. A reference mirror 11 is attached to the substrate stage 4 and reflects light from a laser interferometer 12 to measure a position in the x and y directions of the substrate stage 4 (the y diction is not illustrated). A supporting post 13 stands on the base surface plate 10 and supports a top plate 14.

A mold 3 on the surface of which an concavo-convex pattern P to be transferred to the substrate 1 is formed is fixed to a mold chuck 15 by a mechanical holding unit (not illustrated).

The mold chuck 15 may have a function of correcting a position in a θ direction (rotation around a z-axis) of the mold 3 and the tilt function of correcting a tilt of the mold 3. The mold chuck 15 includes an opening for allowing light emitted by a light source 16 to pass through the opening to the mold 3.

A guide bar 17 is a linear actuator for elevating the mold 3, composed of an air cylinder and a linear motor (which are not illustrated). The guide bar 17 is driven in the Z-axis direction in FIG. 1 to press the mold 3 held by the mold chuck 15 against the substrate 1 or to detach the mold 3 therefrom.

An alignment shelf 18 is suspended from the top plate 14 by a supporting post 19. The guide bar 17 passes through the alignment shelf 18. A gap sensor 20 composed of an electrostatic capacity sensor measures a height (flatness) of the substrate 1 held by the substrate chuck 2.

Through-the-mold (TTM) alignment scopes 30 and 30' used for aliment measurement observe displacement between an alignment mark (a substrate mark) formed on the substrate 1 and an alignment mark (a mold mark) formed on the mold 3. The TTM alignment scopes 30 and 30' includes an optical system and an imaging system or a light-sensitive element. The TTM alignment scopes 30 and 30' observe displacement between the substrate 1 and the mold 3 in the x and y directions.

An off-axis alignment scope 31 for global alignment is arranged on the undersurface of the alignment shelf 18 and observes a position of the alignment mark (the substrate mark). The off-axis alignment scope 31 is the one that observes a position on the xy plane of the alignment mark formed on the substrate 1 held by the substrate chuck 2 not via the mold mark provided on the mold 3. Furthermore, the off-axis alignment scope 31 observes a reference mark 33 described later not via the mold 3. The off-axis alignment scope 31 may change the position in the xy plane according to the change of a shot size and a shot layout to respond to change in the position of alignment mark formed on the substrate 1.

A resin supply mechanism 32 includes a nozzle for supplying the resin 5 as an imprint material to the surface of the substrate 1. The present exemplary embodiment uses a photocuring resin, as the imprint material, which is cured by irradiating the resin with light. The wavelength of light may be determined by the resin to be used. Since the resin is irradiated with light with the pattern on the mold pressed against the resin, the mold is produced by a light transmissive material (quartz, for example).

The reference mark 33 is arranged the substrate stage 4. A control unit 100 controls the above actuators and sensors to cause the apparatus to perform imprint operation.

In the imprint apparatus IMP according to the first exemplary embodiment, as illustrated in FIG. 1, at least one of the resin 5 supplied as the imprint material to the substrate 1 and the mold 3 on which the pattern P is formed is pressed against the other. The pattern P on the mold 3 is brought into contact with the resin 5 to fill the concavo-convex shape of the pattern P with the resin 5. The resin 5 is irradiated with light from the light source 16 to be cured with the pattern P filled with the resin 5 and then the mold is detached from the cured resin. The detachment of the mold from the resin is referred to as "mold release."

A series of these operations are repeated to transfer the pattern of the mold to a plurality of shot positions on the substrate. The Imprint operation in which the pattern of the mold is transferred to the plurality of shot positions on the substrate is controlled by the control unit 100.

The mold release according to the present exemplary embodiment is described with reference to FIG. 2 and FIGS. 3A and 3B.

Figure 2:
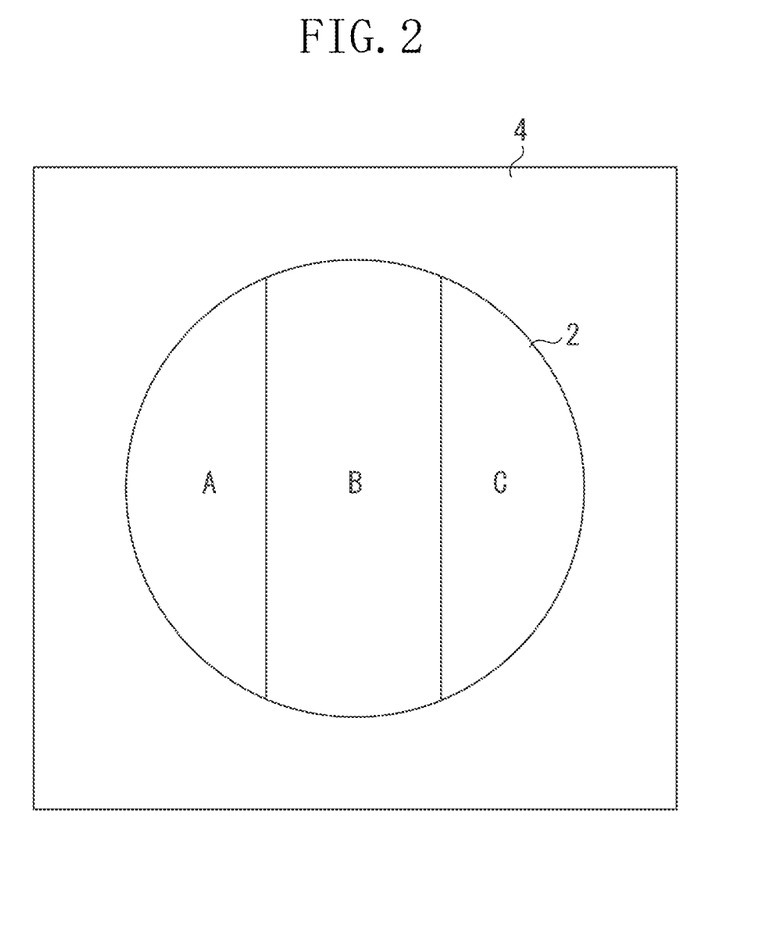
FIG. 2 illustrates a substrate chuck according to the first exemplary embodiment.

FIG. 2 illustrates the substrate chuck 2 (substrate holding mechanism) for holding the substrate 1. Herein, a vacuum chuck is used as the substrate chuck 2 to suck and hold the substrate 1. As illustrated in FIG. 2, the substrate chuck 2 is divided into three areas A, B, and C where suction force may be independently set. The substrate chuck 2 is thus divided to allow the substrate 1 to be held by a different suction force. The substrate chuck 2 is arranged over the substrate stage 4. The substrate stage 4 is driven to control the position of the substrate 1.

In the imprint apparatus according to the present exemplary embodiment, the control unit 100 controls the suction force of the substrate chuck 2 holding the substrate 1 to reduce a pattern defect occurring at the time of mold release. The control of the suction force by the substrate chuck 2 will be described below with reference to FIGS. 3A and 3B.

Figure 3A:
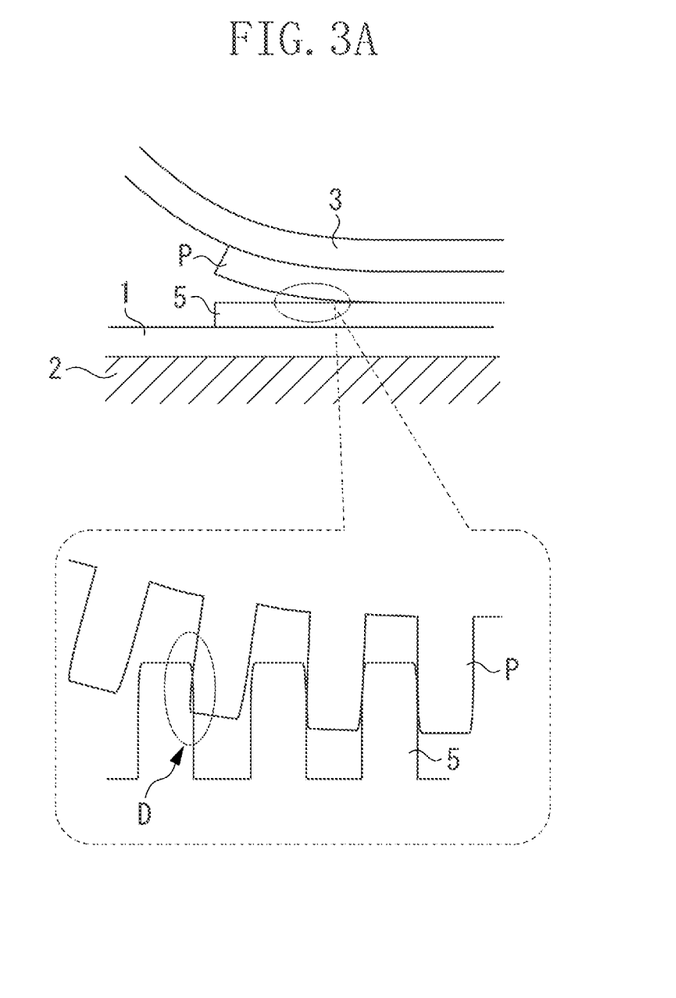
FIGS. 3A and 3B illustrate cross sections around the periphery of a mold and a substrate at the time of mold release according to the first exemplary embodiment.
Figure 3B:
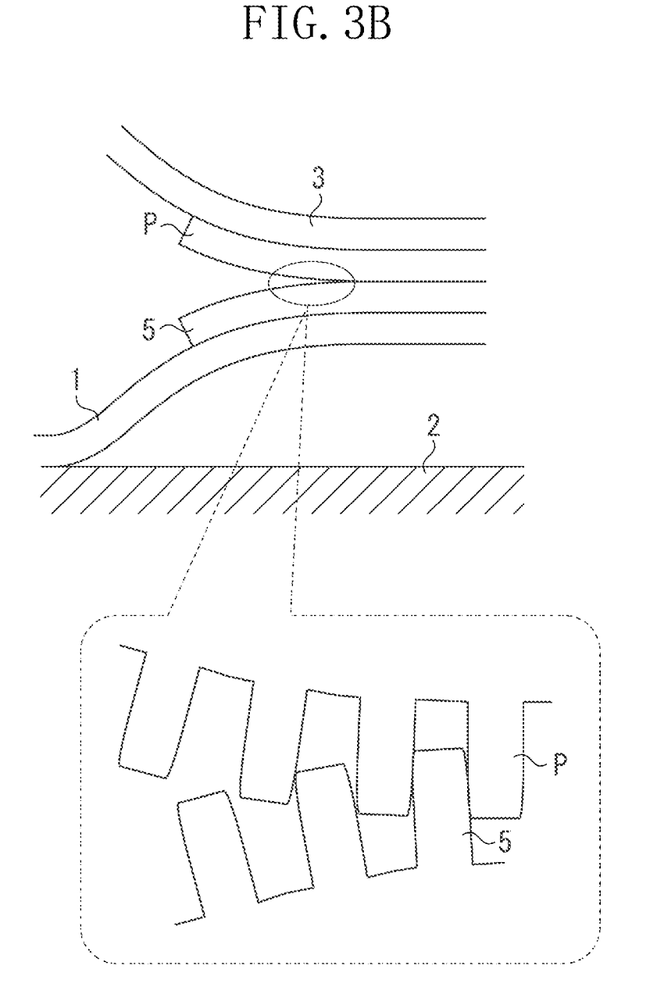

FIGS. 3A and 3B illustrate the cross section of the substrate 1 and the mold 3 at the time of mold release. FIG. 3A illustrates the cross section of the substrate 1 and the mold 3 in a case where the suction force (suction pressure) of the substrate chuck 2 is set to a "high" level. FIG. 3B illustrates the cross section of the substrate 1 and the mold 3 in a case where the suction force (suction pressure) is set to a "medium" level.

In FIG. 3A, the suction force of the substrate chuck 2 is high, so that the substrate 1 is fixed to the substrate chuck 2 at the time of mold release. The suction force (attracting force) indicates the magnitude of force attracting the substrate 1. For example, a "high" suction force indicates that the absolute value of the suction pressure is large and a state where the substrate chuck 2 strongly attracts the substrate 1. A suction pressure is set to −90 kPa, for example, to suck the substrate 1. In this state, the substrate 1 does not float from the substrate chuck 2 at the time of mold release.

In FIG. 3B, the suction force of the substrate chuck 2 is medium, so that apart of the substrate 1 affected by force detaching the mold 3 from the cured resin 5 floats over the substrate chuck 2 at the time of mold release. Herein, the suction force of the "medium" level refers to the one whose magnitude is such that the substrate 1 is sucked to such an extent that a shot where the pattern is brought into contact with the resin and a part of the shot which is adjacent thereto float over the substrate chuck 2 when the mold 3 is detached from the resin 5, as illustrated in FIG. 3B. The medium suction force is smaller in absolute value than the high suction force and the substrate chuck 2 attracts the substrate 1. A suction pressure is set to −30 kPa, for example, to suck the substrate 1.

If the whole surface of the pattern on the mold is vertically detached from the cured resin on the substrate 1 with respect to the surface of the substrate 1, a force required for detaching the mold from the resin is increased to make it difficult to perform the mold release. For this reason, when the mold is detached from the resin, the mold is detached while being bent, as illustrated in FIG. 3A. However, as illustrated by D in FIG. 3A, a strong horizontal force is applied to the resin 5 in which the pattern is formed on the substrate 1 by the pattern on the mold 3 at the time of the mold release. The pattern formed on the substrate 1 may be collapsed, which often tends to produce a defect.

On the other hand, in FIG. 3B, the substrate 1 itself is also bent to perform the mold release in a state like a toothed gear. As a result, a strong horizontal force is hardly applied to the resin 5 transferred on the substrate 1, which enables the reduction of the defect described in FIG. 3A.

As described above, the substrate 1 is bent at the time of detaching the mold 3 to cause the mold 3 to partially float over the substrate chuck 2. When the pattern is formed in the area A illustrated in FIG. 2, the suction force of the substrate chuck 2 sucking the substrate 1 in the area A is set to "medium" level, so that the entire substrate may be displaced from the substrate chuck 2 by a force at the time of the mold release.

For this reason, the substrate 1 in at least one of the areas B and C needs to be sucked by the suction force set to a "high" level to prevent the entire substrate from being displaced from the substrate chuck 2.

As described above, the substrate 1 is sucked by the suction force which is set to the "high" level in one area other than any area where the pattern is transferred among a plurality of areas of the substrate chuck 2. Thus, the control unit 100 controls the suction force of the substrate chuck 2 to allow preventing the substrate 1 from being displaced and reducing defects at the time of the mold release.

Figure 6:
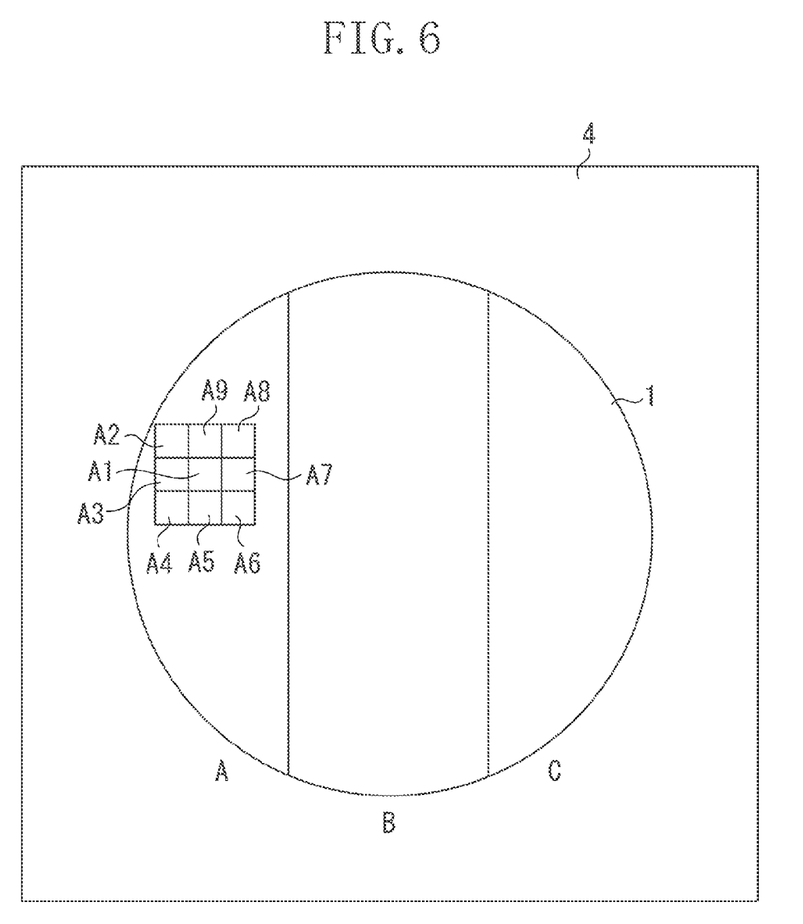
FIG. 6 is a diagram illustrating a relationship between the substrate held by a substrate chuck and a shot position according to the first exemplary embodiment.

FIG. 6 is a diagram illustrating the substrate 1 held by the substrate chuck 2 viewed from the mold side. Each of one shot positions A1 to A9 is illustrated in FIG. 6. The formation of the pattern at the shot position A1 in the area A illustrated in FIG. 6 will be described below. The shot positions A2 to A9 are the ones adjacent to the shot position A1.

Figure 4A:
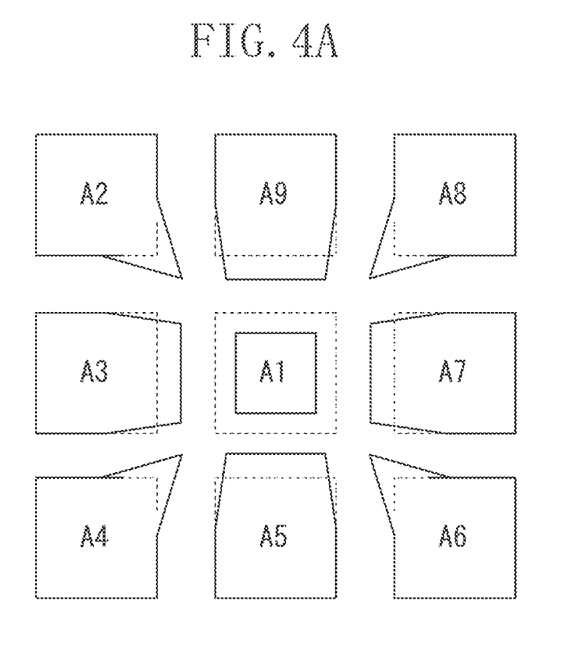
FIG. 4A illustrates local distortion according to the first exemplary embodiment.
Figure 4B:
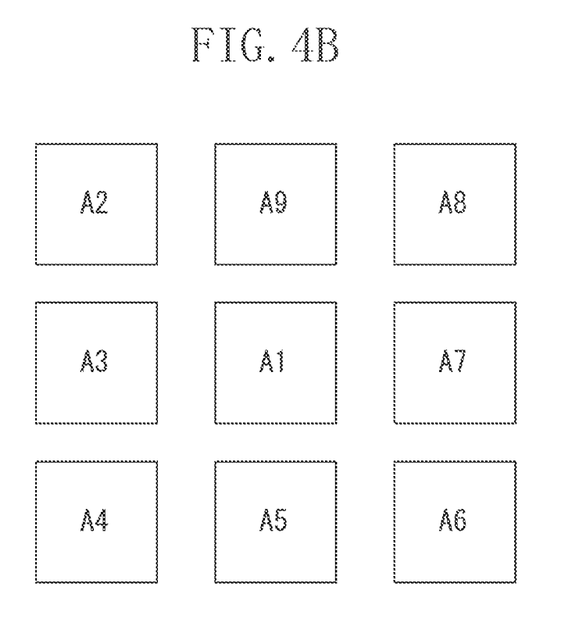
FIG. 4B illustrates a state where the local distortion returns to the original state.

The shot positions A1 to A9 in FIGS. 4A and 4B correspond to the shot positions A1 to A9 described in FIG. 6. FIG. 4A illustrates the local distortion of the shot position A1 and the shots adjacent thereto observed immediately after the mold is detached from the resin. At this point, the suction force of the substrate chuck 2 in the area A is set to the medium level. The suction force of the substrate chuck 2 in the areas B and C is set to the high level. As described above, the suction force thereof in any one of the areas B and C may be set to the high level. In FIG. 4A, a dotted line indicates a shot position where there should be originally and a solid line indicates an actual shot position when the substrate 1 is viewed from the mold 3 side. The shot position indicates a position on the substrate 1 to which the pattern is transferred.

As illustrated in FIG. 4A, the surface of the substrate 1 is locally distorted immediately after the mold is detached from the resin. This is mainly because the substrate 1 locally floats over the substrate chuck 2 at the time of mold release as illustrated in FIG. 3B, however, the substrate 1 is sucked by the substrate chuck 2 before the distortion of the substrate 1 itself caused by the float of the substrate 1 is returned to an original state. Furthermore, the substrate 1 may be locally distorted by heat produced by irradiating the resin with light to cure the resin.

The range of the distortion is different depending on conditions such as the suction force, the stiffness of the substrate, and a mold-release force, however, the range of the distortion may extend to an adjacent pattern area as illustrated in FIG. 4A. It is found that a state in 60 seconds after the mold release is similar to the one in FIG. 4A and the state of the distortion hardly changes even if time passes. During this period, the suction force in the area A is kept at the medium level.

These results show that, even if an attempt is made to transfer the pattern on the mold to the shot position A2 that is one of the shot positions adjacent to the shot position A1 in FIG. 6, for example, an accurate transfer cannot be made because the surface of the substrate 1 is distorted. It is also found that the above result is not changed even if a certain period of time elapses.

For this reason, if the pattern is transferred to the shot position A1 and then the pattern is transferred to shot positions adjacent to the shot position A1, the suction force in the area A illustrated in FIG. 2 is temporarily set to a "low" level.

The suction force set to the "low" level indicates that the suction force is set to 0 kPa to release the substrate 1. The suction force in the area A is set to the "low" level to allow returning the local distortion of the substrate 1 indicated by the solid line in FIG. 4 to the shape of the original shot indicated by the dotted line in FIG. 4B. FIG. 4B illustrates a state where the suction force in the area A is set to the "low" level and the shape of the shot is returned to that of the original state.

This proves that, even if the surface of the substrate 1 is partially distorted immediately after the mold release, the suction force in the corresponding area of the substrate chuck 2 is set to the "low" level to temporarily release the substrate 1 from the substrate chuck 2, returning the distortion of surface of the substrate 1 to the shape of surface of the original substrate 1. Sucking again the substrate 1 after the release of the suction force of the substrate chuck 2 in the area including the shot position to which the pattern is transferred among a plurality of areas is referred to as "suction reset."

Figure 5A:
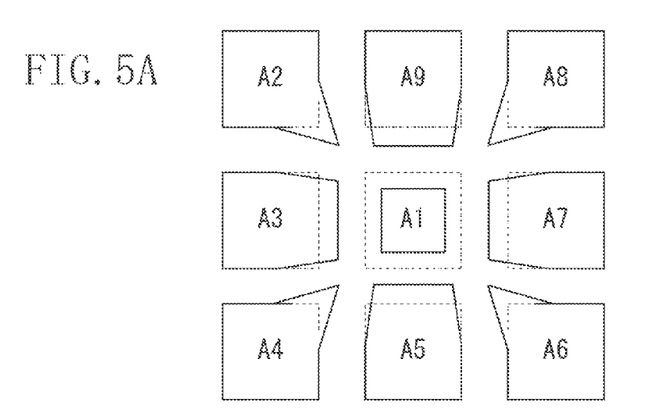
FIGS. 5A, 5B, and 5C illustrate timing at which suction reset is performed and effects of the suction reset according to the first exemplary embodiment.
Figure 5B:
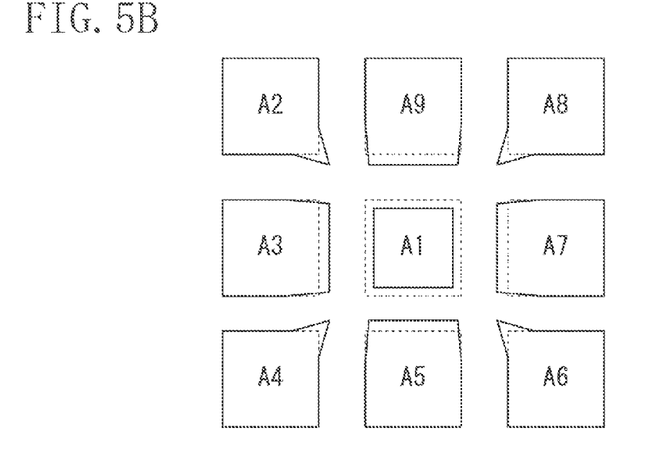
Figure 5C:
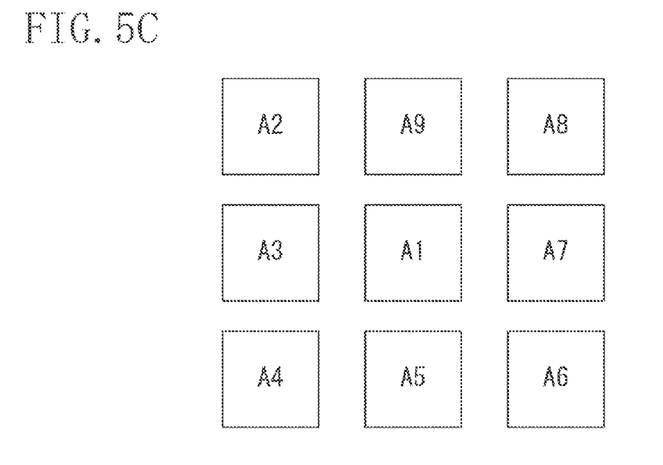

A timing at which the suction reset is performed will be described below with reference to FIGS. 5A to 5C. FIGS. 5A to 5C illustrate results of distortion of the substrate surface in a case where the suction reset is performed immediately after the mold release, at one second after the mold release, and at two seconds after the mold release respectively. The shot positions A1 to A9 in FIGS. 5A to 5C correspond to the shot positions A1 to A9 in FIG. 6.

The result shows that the local distortion is not released unless a predetermined period of time elapses (for two seconds or so in the present exemplary embodiment) after the mold release.

This is attributed to heat of light with which the substrate 1 is irradiated to cure the resin 5. The suction force of the substrate chuck 2 is reset after the heat is cooled to fade out the influence of the heat to allow effectively returning the distortion of the substrate 1 to original.

Resetting the suction force in the area of the substrate chuck 2 corresponding to the shot position to which a patter is transferred after the predetermined period of time for which the influence of the heat is faded out elapses allows correctly transferring the pattern even to adjacent shot positions.

There may be a method in which the suction of the substrate 1 is temporarily released to return the local distortion of the substrate 1 to the original, and the substrate 1 is sucked again. However, repeating the pattern transfer and the suction reset for each shot reduces throughput to affect productivity because the suction reset consumes much time. Therefore, a sequence for improving productivity by decreasing the number of times of the suction reset will be described below. More specifically, the pattern is transferred to a plurality of shot positions and then the "suction reset" is performed.

After the pattern is transferred to the shot position A1, the pattern is not transferred accurately to the shot positions A2 to A9 adjacent to the shot position A1 unless the "suction reset" is performed.

Figure 7A:
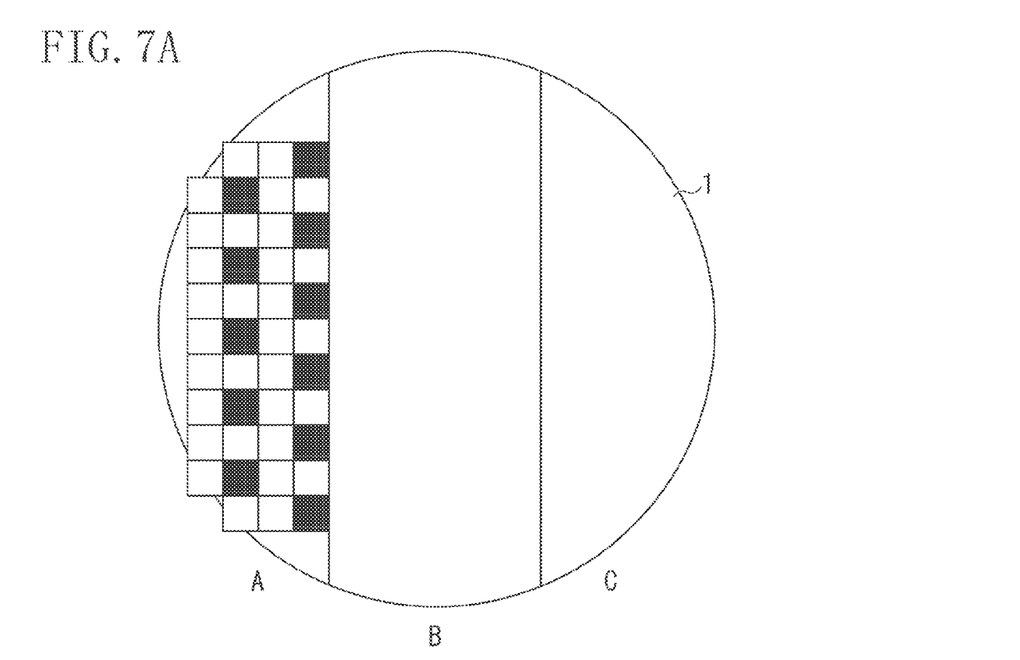
FIGS. 7A and 7B are diagrams illustrating a relationship between the substrate held by the substrate chuck and the shot position according to the first exemplary embodiment.
Figure 7B:
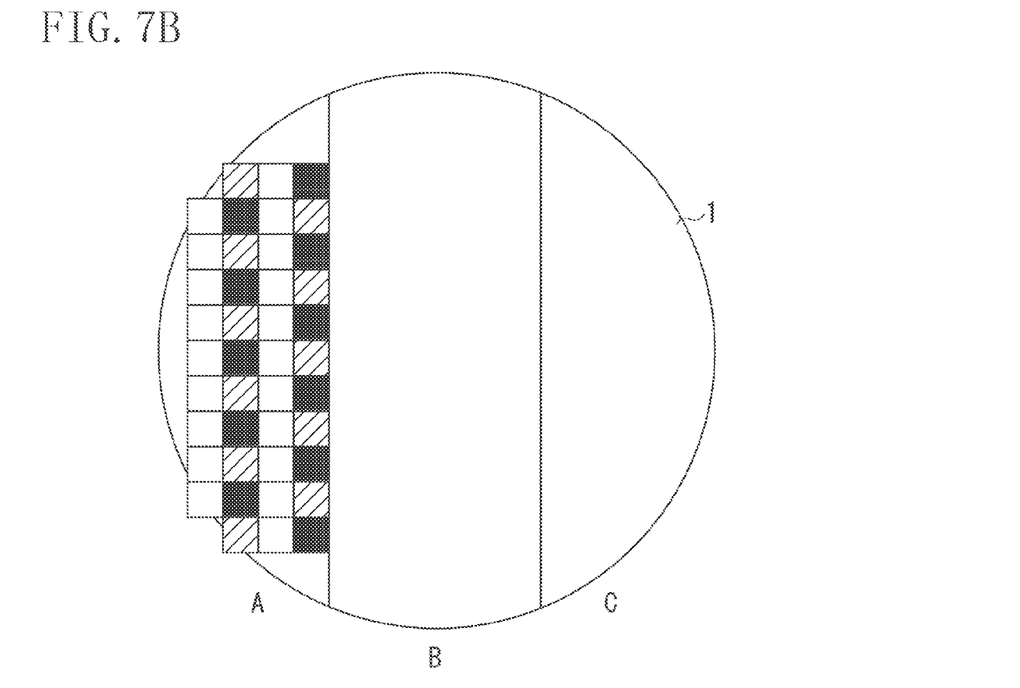

In the present exemplary embodiment, the pattern is sequentially transferred to shot positions which are not adjacent to one another. FIGS. 7A and 7B illustrate a plurality of shot positions formed on the substrate 1 and shot positions which are not adjacent to one another.

The pattern is sequentially transferred to shot positions filled in black in FIG. 7A among a plurality of shot positions on the substrate 1 corresponding to the substrate chuck 2 in the area A. At this point, the suction force in the area A is set to the "medium" level and continues holding the substrate 1. After the pattern is transferred, the suction force in the area A is set to the "low" level and the "suction reset" is performed.

In this period, the suction force in at least one of the areas B and C is set to the "high" level and the substrate 1 is held. Thus, the pattern may be transferred to the shot position which is not affected by distortion. The shot positions which are not adjacent to one another refer to those that are away from the shot position A1 by one shot or more.

After the "suction reset" is finished, the suction force in the area A of the substrate chuck 2 is set again to the "medium" level. Thereafter, the pattern is transferred to shot positions which are different from a plurality of shot positions filled in black in FIG. 7A and not adjacent to one another. Herein, the pattern is sequentially transferred to a plurality of shaded shot positions in FIG. 7B. In this period, the suction force in the area A is set to the "medium" level and continues holding the substrate 1. After the pattern is transferred, the suction force in the area A is set to the "low" level and the "suction reset" is performed.

Repeating the transfer of the pattern to the shot positions which are not adjacent to one another and the "suction reset" allows the transfer of the pattern to all the shot positions corresponding to the area A of the substrate chuck 2 illustrated in FIGS. 7A and 7B.

The example is described above in which the pattern is formed at the shot positions corresponding to the area A of the substrate chuck 2. In the following, an example will be described in which the pattern is formed at the shot positions corresponding to the area B. The suction force in the area B of the substrate chuck 2 is set to the "medium" level and the suction force in at least one of the areas A and C is set to the "high" level, thereby allowing the pattern to be formed in the area B, as is the case with the above description. Similarly to the above, the pattern is formed at the area C. The formation of the pattern may be started at any area. The patterns is formed at a plurality of shot positions on the substrate 1 corresponding to any area and the "suction reset" is performed at any area.

Thereby, the pattern may be transferred with the influence of distortion of the substrate 1 reduced. Furthermore, the number of times of the "suction reset" may be reduced to improve productivity.

In the above, the present exemplary embodiment describes that the substrate chuck 2 is divided into three areas and the high, medium, and low levels to which the suction force is set are independently controlled, thereby allowing forming the pattern at adjacent shot positions with the influence of distortion of the substrate 1 reduced. The imprint apparatus according to the embodiments may perform control with the number of chuck areas and the conditions of the suction force which may be independently controlled increased.

A second exemplary embodiment will be described below. The second exemplary embodiment is fundamentally similar in configuration to the first exemplary embodiment and is further characterized by a sequence for improving productivity. More specifically, the shot position to which the pattern is transferred between the "suction resets" described in the first exemplary embodiment is devised to reduce the time of the "suction reset" described in the first exemplary embodiment.

The first exemplary embodiment describes that the suction reset needs to be started after the predetermined time period elapses to reduce the influence of heat of light with which the substrate 1 is irradiated to cure the resin 5. A case where the "suction reset" is performed without waiting for the time for which the influence of heat is reduced is described with reference to the substrate 1 illustrated in FIGS. 8A and 8B.

Figure 8A:
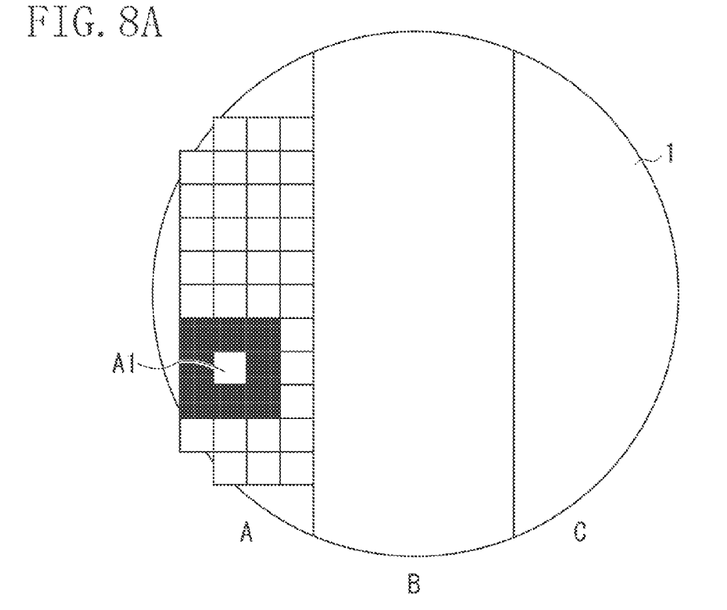
FIGS. 8A and 8B are diagrams illustrating a relationship between the substrate held by the substrate chuck and the shot position according to a second exemplary embodiment.

The shot position to which the pattern is transferred immediately before the area A of the substrate chuck 2 in FIG. 8A is subjected to the suction reset is taken as A1. The suction pressure of the substrate chuck 2 in the area A is set to the "medium" level. After the pattern is transferred to the shot position A1, the suction pressure in the area A is set to the "low" level. In the first exemplary embodiment, after the influence of heat is reduced enough, the suction pressure in the area A is set again to the "medium" level to hold the substrate 1.

In the present exemplary embodiment, before the influence of heat in the shot position A1 is reduced, the suction pressure in the area A is set to the "medium" level to hold the substrate 1 again. In this case, as illustrated in FIG. 5B, local distortion remains in the shot positions (the shot positions filled in black) adjacent to the shot position A1. For this reason, it is not desirable to transfer the pattern to the shot positions adjacent to the shot position A1 illustrated in FIG. 8A.

For this reason, in the present exemplary embodiment, the pattern is not transferred, after the suction reset is performed, to the shot positions adjacent to the shot positions on which the pattern is formed immediately before the suction reset is performed.

Figure 8B:
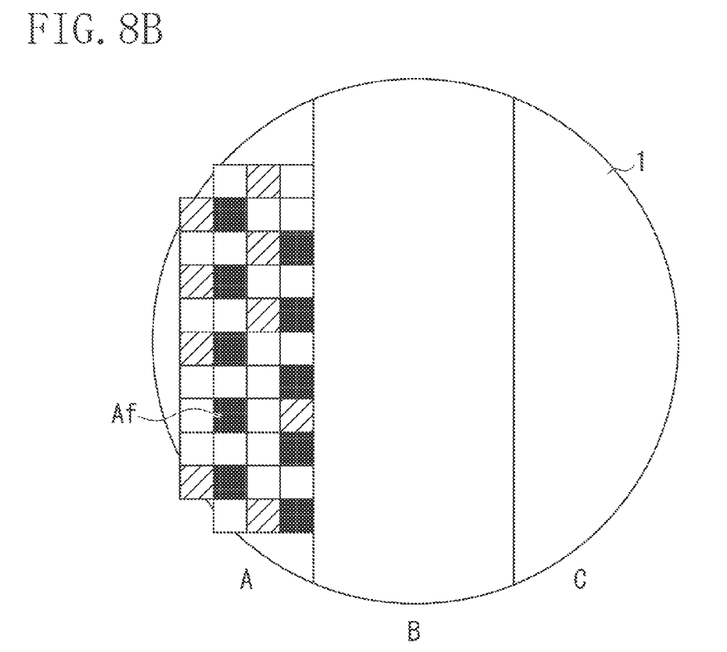

FIG. 8B illustrates shot positions to which the pattern is transferred before and after the suction reset is performed. The shot positions filled in black in FIG. 8B are those to which the pattern is transferred before the suction reset is performed. A shot position Af is the one to which the pattern is transferred last among others. The shaded shot positions are those to which the pattern is transferred after the suction reset is performed.

In the present exemplary embodiment, as illustrated in FIG. 8B, the pattern is not transferred to the shot positions adjacent to the shot position Af immediately before the suction reset is performed.

This enables performing the suction reset without waiting for the time for which the influence of heat is reduced and transferring the pattern. Performing the suction reset without waiting for the time for which the influence of distortion of the substrate 1 due to heat is reduced allows productivity to be improved.

A third exemplary embodiment will be described below. The above exemplary embodiments describe the pattern transfer and the suction reset performed under the condition that the suction force of the substrate chuck 2 in the area A is set to the "medium" level and the suction force of the substrate chuck 2 in at lease one of the areas B and C is set to the "high" level. The exemplary embodiments also describe the case where the pattern is transferred to all the shot positions corresponding to one area of the substrate chuck 2 and then the pattern is transferred to the shot positions corresponding to other areas.

The present exemplary embodiment describes an imprint method for continuously transferring the pattern to two areas among the areas of the substrate chuck 2 divided into a plurality of areas. A flow chart illustrated in FIG. 9 indicates a general flow including switch of suction force.

A substrate is carried into an imprint apparatus. A substrate to which the pattern is transferred is carried into the substrate chuck 2 by a substrate conveyance mechanism (not illustrated). Description is made using the imprint apparatus IMP described in FIG. 1 as the imprint apparatus and the substrate chuck 2 described in FIG. 2 as a substrate chuck.

Figure 9:
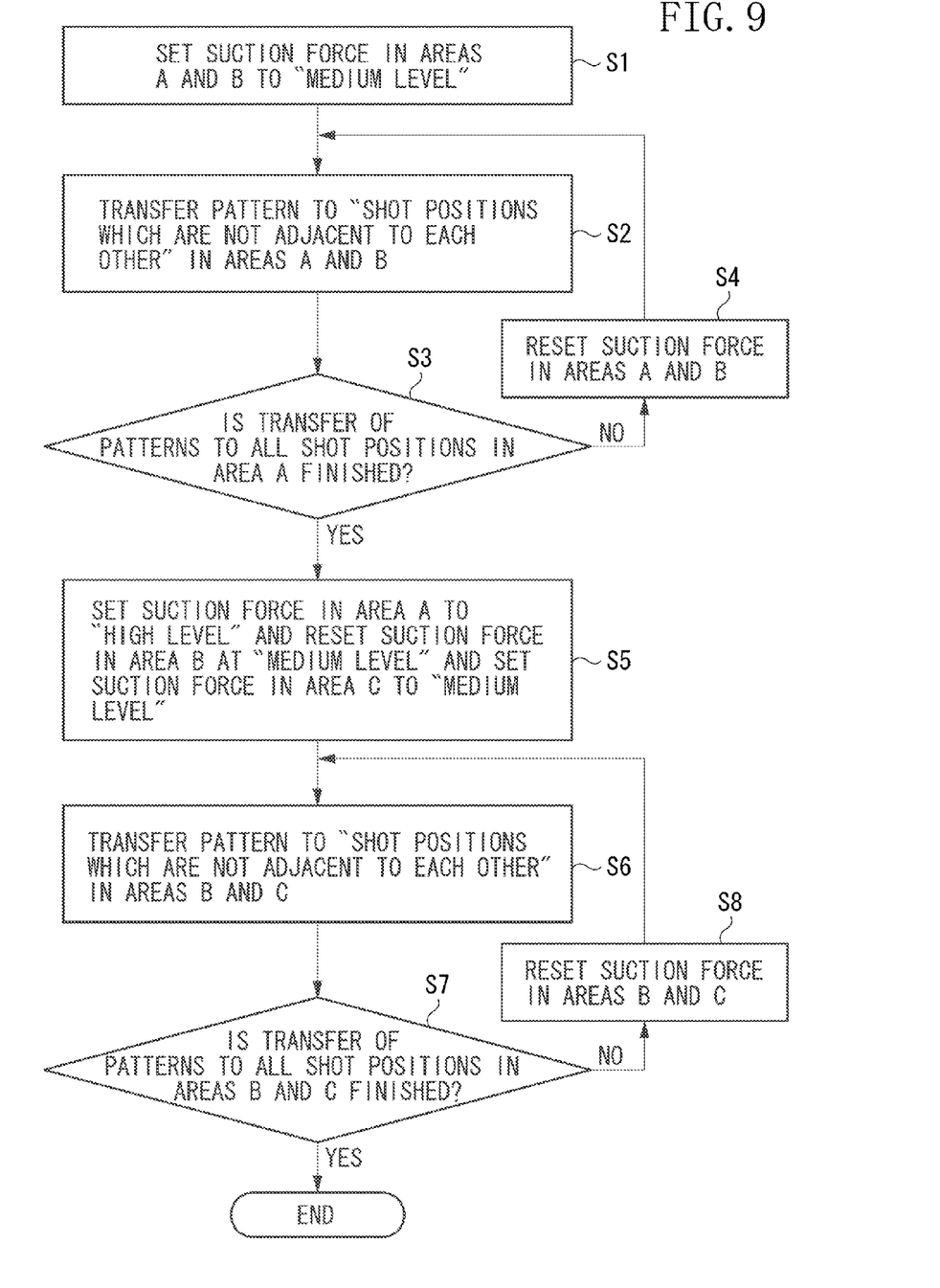
FIG. 9 is a flow chart of a suction control according to a third exemplary embodiment.

In operation S1, a suction force in the areas A and B of the substrate chuck 2 is set to the "medium" level. A suction force in the remaining area C thereof is set to the "high" level and the substrate 1 is held by the substrate chuck 2.

In operation S2, the pattern is transferred to "shot positions which are not adjacent to one another" in the areas A and B. The pattern may be transferred using the imprint method described in the above imprint apparatus. In the abovementioned exemplary embodiments, the pattern is transferred to the shot positions only in the area A. In the present exemplary embodiment, however, the pattern is sequentially transferred to the shot positions corresponding to the areas A and B. When the transfer of the pattern to all the "shot positions which are not adjacent to one another" corresponding to the areas A and B is finished, the processing proceeds to operation S3.

In operation S3, a control unit 100 determines whether the pattern is transferred to all the shot positions in at least the area A. If the transfer of the pattern to all the shot positions corresponding to the area A of the substrate chuck 2 is finished (YES in operation S3), the processing proceeds to operation S5. If the transfer of the pattern to all the shot positions corresponding to the area A thereof is not finished (NO in operation S3), the processing proceeds to operation S4.

In operation S4, the suction reset is performed in the areas A and B. The suction force in the areas A and B of the substrate chuck 2 is set to the "low" level to release the substrate 1. The suction force in the areas A and B of the substrate chuck 2 is set to the "medium" level again to suck the substrate 1. After the suction reset is performed, the processing returns to operation S2.

Thus, in the present exemplary embodiment, the suction reset is performed in the two areas at the same time. Until the pattern is transferred to all the shot positions corresponding to at least the area A, operations S2 to S4 are repeated. During this period, the suction force in the area C is set to the "high" level, so that the substrate 1 may be held by the substrate chuck 2 even if the areas A and B are subjected to the suction reset at the same time.

In operation S5, the suction force of the substrate chuck 2 is switched. Specifically, the suction force in the area A is set to the "high" level. Then, the suction force in the area B is set to the "low" level, the suction reset is performed and the suction force therein is set again to the "medium" level. At this point, the suction force in the area C is set to the "medium" level.

The shot positions corresponding to the area A of the substrate 1 may be distorted immediately after the pattern is transferred. Since the transfer of the pattern to all the shot positions in the area A is finished in operation S3, the suction reset is not performed. However, after the suction reset is performed for suction force in the area A, the suction force may be set to the "high" level. In operation S5, if the transfer of the pattern to all the shot positions corresponding to the area B is finished, the suction force may be set to the "high" level as is the case with the area A.

In operation S5, the suction force of the substrate chuck 2 is switched. In operation S6, the pattern is transferred to the "shot positions which are not adjacent to one another" in the areas B and C. As is the case with the description of operation S2, the pattern is sequentially transferred to the shot positions corresponding to the areas B and C. If the patterns are transferred to all the "shot positions which are not adjacent to one another" corresponding to the area B and C, the proceeding proceeds to operation S7.

In operation S7, the control unit 100 determines whether the pattern is transferred to all the shot positions in the areas B and C. If the transfer of the pattern to all the shot positions corresponding to the areas B and C of the substrate chuck 2 is finished (YES in operation S7), the imprint operation is ended. If the transfer of the pattern to all the shot positions in the areas B and C thereof is not finished (NO in operation S7), the proceeding proceeds to operation S8 described later.

In operation S8, the suction reset is performed in the areas B and C. The suction force in the areas B and C of the substrate chuck 2 is set to the "low" level to release the substrate 1 and the suction force in the areas B and C of the substrate chuck 2 is set again to the "medium" level to suck the substrate 1. After the suction reset is performed, the processing returns to operation S6.

Thus, in the present exemplary embodiment, the suction reset is performed in the two areas at the same time even after the pattern is transferred to all the shot positions corresponding to the area A. Until the pattern is transferred to all the shot positions corresponding to the areas B and C, operations S6 to S8 are repeated.

In operations S6 to S8, the suction force in the areas B and C is varied at the same time. If the transfer of patterns to all the shot positions corresponding to the area B of the substrate chuck 2 is finished when operation S7 is ended, for example, the suction reset may be performed only in the area C in operation S8. Thus, in operations S6 to S8, if the transfer of the pattern to all the shot positions corresponding to any of the two areas is finished, there is no need for varying the suction force in the two areas at the same time.

The conditions of the suction force in the areas A, B, and C and the timing at which the substrate chuck 2 performs the suction reset are not limited to the flow chart in FIG. 9 indicating the sequence of the present exemplary embodiment. Distortion on the substrate 1 may be released, which one aspect of the embodiments is directed to, in any combination of the conditions of the suction force and the timing at which the substrate chuck 2 performs the suction reset.

A forth exemplary embodiment is described below. The forth exemplary embodiment is fundamentally similar in configuration to the first exemplary embodiment and is characterized by a sequence for improving productivity. In the first exemplary embodiment, the pattern is transferred to the shot positions which are not adjacent to one another, and then the suction reset is performed in the area A, and the pattern is transferred to all the shot positions in the area A. During this period, the pattern is not transferred to the shot positions in other areas. In the present exemplary embodiment, the suction reset is performed in a certain area of the substrate chuck 2 while the pattern is being transferred to the shot positions corresponding to an area different from the certain area.

Figure 10:
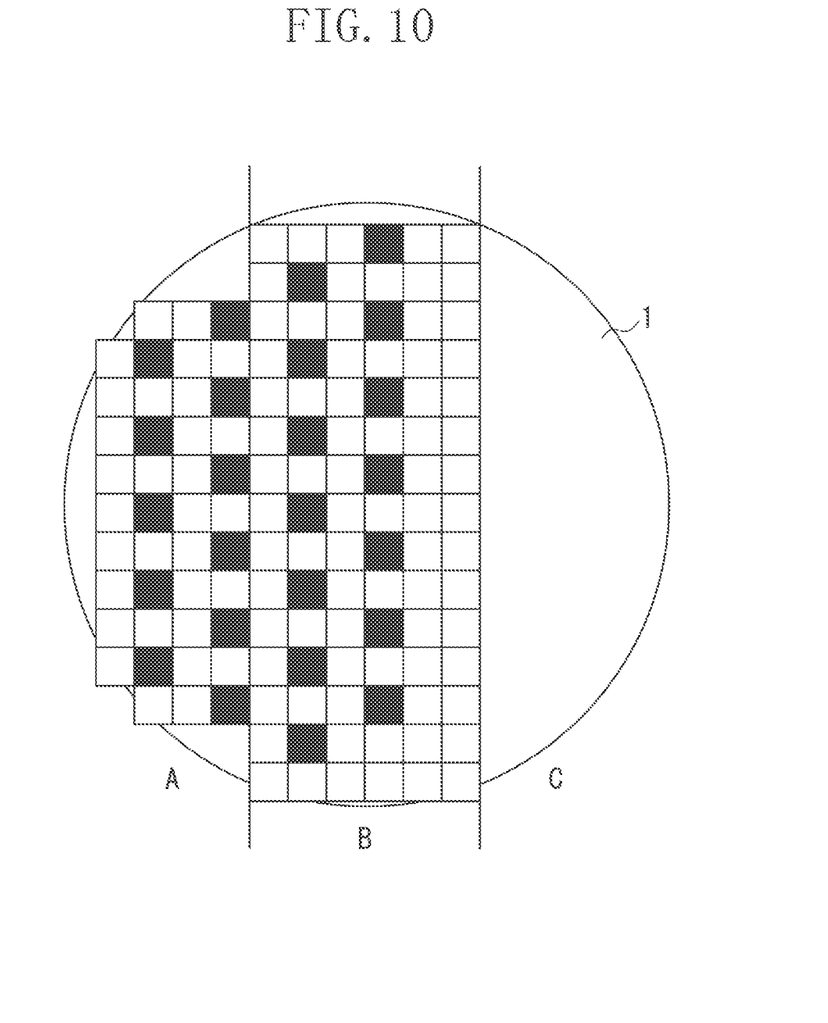
FIG. 10 is a diagram illustrating a relationship between the substrate held by the substrate chuck and the shot position according to a fourth exemplary embodiment.

A method for transferring the pattern in the forth exemplary embodiment will be described in detail below with reference to FIG. 10. FIG. 10 illustrates the substrate 1 held by the substrate chuck 2 and a part of the shot positions. Description is made by using the substrate chuck 2 divided into a plurality of areas as described in FIG. 2.

At first, the pattern is transferred to the shot positions which are not adjacent to one another among the shot positions corresponding to the area A. At this point, the suction force in the area A of the substrate chuck 2 is set to the "medium" level to hold the substrate 1.

After the pattern is transferred to the shot positions which are not adjacent to one another in the area A, the pattern is transferred to the shot positions which are not adjacent to one another among the shot positions corresponding to the area B in succession to the area A before the suction reset is performed in the area A. At this point, the suction force in the area B is set to the "medium" level to hold the substrate 1.

The suction reset in the area A is executed while the pattern is being transferred to the shot positions which are not adjacent to one another among the shot positions corresponding to the area B as illustrated in FIG. 10. At this point, the suction force in the area C is set to the "high" level to hold the substrate 1. For this reason, the substrate 1 is not significantly displaced.

At the time of the mold release at which the mold is detached from the cured resin, a very strong force is applied to the substrate 1. For this reason, it is not desirable to execute the suction reset in the area A at the time of the mold release even if the pattern is being transferred to the shot positions corresponding to the area B. In the present exemplary embodiment, the suction reset may be executed in the area A in the shot position distant by two shots from the area A among the shot positions corresponding to the area B while the resin supplied to the substrate 1 is being brought into contact with the mold.

After the suction reset is performed in the area A, the suction force in the area A may be set to the "high" level to hold the substrate 1 and the suction force in the area C may be set to the "medium" level from the "high" level. Thereby, after the pattern is transferred to the shot positions which are not adjacent to one another among the shot positions corresponding to the area B, the pattern may be transferred to the shot positions which are not adjacent to one another among the shot positions corresponding to the area C in succession to the area B.

Repeating the operation according to the foregoing present exemplary embodiment allows performing the suction reset of the substrate 1 while the pattern is continuously being transferred. In this case, it is desirable to divide the substrate chuck 2 into three or more areas.

Thus, in the present exemplary embodiment, if the suction reset is performed in the area A, the suction reset is performed while the pattern is being transferred to the shot positions on the substrate 1 corresponding to the areas B or C. It is desirable to perform the suction reset when the mold release is not being performed.

Thereby, the suction reset may be performed while the pattern is being formed to allow shortening of time required for the suction reset, improving productivity.

Although the abovementioned exemplary embodiments describe the imprint technique using a photo-curing method in which the resin 5 is irradiated with light to cure the resin 5, the embodiments are not limited to the exemplary embodiments. Other than the photo-curing method, there is a method in which a thermosetting polymer resin is used as an imprint material and heated to be cured. The embodiments may also be applied to the imprint apparatus using the heat.

A method for producing a device will be described below. The method for producing devices (such as a semiconductor integrated circuit element, a liquid crystal display element, and others) includes a process for forming a pattern on a substrate (a wafer, a glass plate, and a film substrate) using the above imprint device. Furthermore, the method for producing a device may include a process for etching a substrate on which the pattern is formed. A method for producing other articles such as a patterned media (a recording medium) and an optical element may include other processes for processing a substrate on which patterns are formed. The method for producing articles according to the present exemplary embodiment is more advantageous in at least one of performance, quality, productivity, and production cost of an article than a conventional method.

While the embodiments have been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-101311 filed Apr. 28, 2011, which is hereby incorporated by reference herein in its entirety.

What is claimed is:

1. An imprint apparatus for forming a pattern of an imprint material on a substrate using a mold, the apparatus comprising:
   a substrate holding mechanism configured to be divided into a plurality of areas, capable of varying an attracting force for attracting the substrate in each of the plurality of the areas and holding the substrate; and
   a control unit;
   wherein the control unit is configured to perform contacting and separating operations forming patterns not adjacent to one another in a first area of the plurality of the areas, and then perform reducing the attracting force in the first area to a level below the attracting force at the time of the separating operations while holding the substrate in at least one other area of the plurality of the areas, and then increasing the attracting force in the first area.

2. The imprint apparatus according to claim 1, wherein the control unit is configured to maintain the attracting force in the first area at a level below the attracting force at the time of the separating operations for a predetermined time period and then perform reducing the attracting force in the first area, and then perform increasing the attracting force in the first area.

3. The imprint apparatus according to claim 1, wherein the control unit is configured to apply an attracting force during the separating operations such that the substrate partially floats over the substrate holding mechanism.

4. The imprint apparatus according to claim 1, wherein the control unit is configured to apply an attracting force in the at least one other area during the separating operations that does not distort the substrate in the at least one other area.

5. The imprint apparatus according to claim 1, wherein the control unit is configured to perform imprinting and separating operations forming patterns distant by at least one pattern.

6. The imprint apparatus according to claim 1, wherein the control unit is configured to perform reducing the attracting force in a first area while a pattern is being formed in a different area.

7. An imprint apparatus for forming a pattern of an imprint material on a substrate using a mold, the apparatus comprising:
   a substrate holding mechanism configured to be divided into a plurality of areas, capable of varying an attracting force for attracting the substrate in each of the plurality of the areas; and
   a control unit,
   wherein the control unit is configured to
      perform separating the mold from the imprint material in a first area of the plurality of the areas such that the attracting force in the first area is reduced to a level below the attracting force for holding the substrate, and
      then perform reducing the attracting force in the first area to a level below the attracting force at a time of the separating the mold from the imprint material while attracting the substrate in at least one other area of the plurality of the areas, and
      then perform increasing the attracting force in the first area.

8. The imprint apparatus according to claim 7, wherein the control unit is configured to perform reducing the attracting force in the first area to a level below the attracting force at the time of the separating the mold from the imprint material for a predetermined time period.

9. The imprint apparatus according to claim 7, wherein the control unit is configured to apply an attracting force during the separating the mold from the imprint material such that the substrate partially floats over the substrate holding mechanism.

10. The imprint apparatus according to claim 7, wherein the control unit is configured to apply an attracting force in the at least one other area during the separating the mold from the imprint material that does not distort the substrate in the at least one other area.

11. The imprint apparatus according to claim 7, wherein the control unit is configured to perform contacting the mold to the imprint material and separating the mold from the imprint material for forming patterns distant by at least one pattern.

12. The imprint apparatus according to claim 7, wherein the control unit is configured to perform reducing the attracting force in the first area, after separating the mold from the imprint material, while a pattern is being formed in a different area.

* * * * *